(12) United States Patent
Yamamoto et al.

(10) Patent No.: US 6,989,199 B2
(45) Date of Patent: Jan. 24, 2006

(54) COPPER FOIL FOR PRINTED-WIRING BOARD AND COPPER-CLAD LAMINATE USING COPPER FOIL FOR PRINTED-WIRING BOARD

(75) Inventors: Takuya Yamamoto, Saitama (JP); Masaru Takahashi, Saitama (JP); Masamichi Yamada, Saitama (JP)

(73) Assignee: Mitsui Mining & Smelting Co., Ltd., Tokyo (JP)

( * ) Notice: Subject to any disclaimer, the term of this patent is extended or adjusted under 35 U.S.C. 154(b) by 159 days.

(21) Appl. No.: 10/415,143

(22) PCT Filed: Jul. 26, 2002

(86) PCT No.: PCT/JP02/07601

§ 371 (c)(1),
(2), (4) Date: Apr. 25, 2003

(87) PCT Pub. No.: WO03/015483

PCT Pub. Date: Feb. 20, 2003

(65) Prior Publication Data

US 2004/0053019 A1 Mar. 18, 2004

(30) Foreign Application Priority Data

Aug. 6, 2001 (JP) .................................. 2001-237704

(51) Int. Cl.
*B32B 15/20* (2006.01)
*B32B 15/08* (2006.01)
*H05K 1/09* (2006.01)
*H05K 3/38* (2006.01)
*C25D 7/06* (2006.01)

(52) U.S. Cl. ................. 428/607; 428/612; 428/626; 428/658; 428/675; 428/687; 428/935

(58) Field of Classification Search ................ 428/607, 428/612, 626, 658, 680, 675, 935, 687; 205/111
See application file for complete search history.

(56) References Cited

U.S. PATENT DOCUMENTS

| 3,857,681 | A | * | 12/1974 | Yates et al. | ................ | 428/554 |
| 4,456,508 | A | * | 6/1984 | Torday et al. | ............ | 428/612 |
| 4,469,567 | A | * | 9/1984 | Torday et al. | ............. | 205/50 |
| 4,572,768 | A | * | 2/1986 | Wolski et al. | ............ | 205/111 |
| 4,640,747 | A | * | 2/1987 | Ueno et al. | ................ | 156/151 |
| 5,456,817 | A | * | 10/1995 | Hino et al. | ................ | 205/125 |
| 5,482,784 | A | * | 1/1996 | Ohara et al. | .............. | 428/607 |
| 6,117,300 | A | * | 9/2000 | Carbin et al. | ............. | 205/125 |
| 6,224,991 | B1 | * | 5/2001 | Yates et al. | ................ | 428/607 |
| 6,497,806 | B1 | * | 12/2002 | Endo | ......................... | 205/111 |
| 2004/0038049 | A1 | * | 2/2004 | Suzuki et al. | ............. | 428/457 |

FOREIGN PATENT DOCUMENTS

| EP | 269208 A1 | * | 6/1988 |
| EP | 649917 A1 | * | 4/1995 |
| JP | 05-029740 | * | 2/1993 |
| JP | 08-335776 | * | 12/1996 |
| JP | 09-087889 | * | 3/1997 |
| JP | 11-340595 | * | 12/1999 |
| JP | 2000-280401 | * | 10/2000 |
| JP | 2002-176242 | * | 6/2002 |

OTHER PUBLICATIONS

RD 194003 (Research Disclosure 194003) published Jun. 1980, 2 pages.*

* cited by examiner

*Primary Examiner*—John J. Zimmerman

(57) ABSTRACT

The object is to provide a copper foil excellent in the property of selective etching between a resistor layer and a copper layer required in production of a printed-wiring board, and also excellent in UL heat resistance. For this purpose, a copper foil for printed-wiring board comprising a nodular treatment side on one side, wherein a nickel-zinc alloy layer is formed on the nodular treatment side is used for applications of printed-wiring boards. At the same time, a production method suitable for production of the copper foil is provided.

4 Claims, 8 Drawing Sheets

(a) Producing a copper clad laminarte (b) Etching away of a copper foil (c) Laser drilling processing (d) Copper plating (Panel plating method)

(e) Forming etching resist layers (f) Light exposure and development of etching resist layers (g) Copper etching (d) Forming etching resist layers (e) Light exposure and development of etching resist layers (f) Peeling off etching resist layers (g) Copper plating

COPPER FOIL FOR PRINTED-WIRING BOARD AND COPPER-CLAD LAMINATE USING COPPER FOIL FOR PRINTED-WIRING BOARD

CROSS-REFERENCE TO RELATED APPLICATIONS

The present application is a national stage filing under 35 U.S.C. §371 of PCT/JP02/07601, filed on Jul. 26, 2002, designating the U.S.

TECHNICAL FIELD

The present invention relates to a copper foil for printed-wiring board and a method of producing the same, and a copper-clad laminate using the copper foil for printed-wiring board.

BACKGROUND ART

For copper foils that have been conventionally used, a various kinds of copper foils are introduced to the market, and which copper foil should be used has been determined depending on the uses of printed-wiring boards. They include, for example, copper foils comprising nickel layers for forming resistors, heat-resisting copper foils to be used for sites that are exothermically affected in a direct manner by electronic equipment, and copper foils having excellent chemical resistance that are advantageously used for formation of fine pitch circuits.

In the trend in recent years toward miniaturization of electric equipment, miniaturization is also required for the printed-wiring board to be contained therein, and the formed copper foil circuit is further reduced in width. Furthermore, as computers operate faster, the processing speed is also enhanced, and clock frequencies are continuously increasing. Thus, for keeping up with improvement in performance of computer apparatuses, and achieving further miniaturization, provision of fine pitch circuits having increased wiring densities becomes essential.

As the wiring density of the printed-wiring board is increased and components implemented therein are further integrated, the amount of heat generation is increased, thus causing a problem. For example, the strength of bonding between the copper foil forming the circuit of the printed-wiring board and a substrate is reduced with time, and in some extreme cases, the copper foil circuit may be peeled off spontaneously from the base material. Therefore, current materials for printed-wiring boards are subjected to a variety of treatments to prevent problems before they happen.

The printed-wiring board can be considered as a composite product composed of a metal and a resin material, and thus improvement of its heat resistance will be influenced by a variety of factors such as the composition of the resin material and the type of surface treatment of the cupper foil. As copper foils having excellent heat resistance for printed-wiring boards, those having thick zinc layers or brass layers formed on nodular treatment sides thereof have been widely known. That is, the heat resistance with respect to the printed-wiring board generally refers to that of the product conforming to UL Standard. The thick zinc layer or brass layer provided on the nodular treatment side of the copper foil for ensuring conformation to UL Standard exhibits excellent performance to secure heat resistance.

On the other hand, in formation of small fine pitch circuits, the printed-wiring board comprising a 50-$\mu$m pitch signal transmission circuit with its circuit width of 25 $\mu$m and its inter-circuit gap of 25 $\mu$m has also commonly produced. Thin copper foils have been used in production of printed-wiring boards comprising such fine circuits because a satisfactory etching property is required when the copper foil is etched to form a circuit. Also, the additive method has been widely used in which an outer-layer copper foil is once completely etched away, and thereafter the copper foil circuit is formed by the plating method or the like.

However, for processing fine via holes and the like, laser drilling processing has been used in recent years, thus making it difficult to process the via hole with the copper foil bonded thereto, and therefore the conformal mask method in which the outer-layer copper foil is partially etched away to carry out laser drilling processing, the method in which the outer-layer copper foil for improving accuracy of position for drilling process is wholly etched away, and so on are employed. Then, after laser drilling processing is carried out, a copper layer is formed through the panel plating method and patterned to form a circuit in the site in which the copper foil has been etched away, or a copper foil circuit is directly formed by the additive method.

The problem arising in such methods is that after the copper foil is once removed, a surface treatment layer that would exist if the original copper foil were used does not exist in the interface between the circuit formed by the panel plating method or the additive method and the substrate. That is, absence of the surface treatment layer means that in the circuit portion is provided no means for purposely improving its chemical resistance and heat resistance.

Therefore, in particular, the heat resistance property of that circuit portion is significantly reduced compared to the case where a normal copper foil having improved heat resistance is used, and materials and methods preventing such a problem from arising have been desired.

SUMMARY OF THE INVENTION

Then, as a result of conducting vigorous studies, the inventors of the present invention have considered that the above described problem can be solved by providing a copper foil comprising a nickel-zinc alloy layer on the nodular treatment side. The present invention will be described below.

Figure 1:
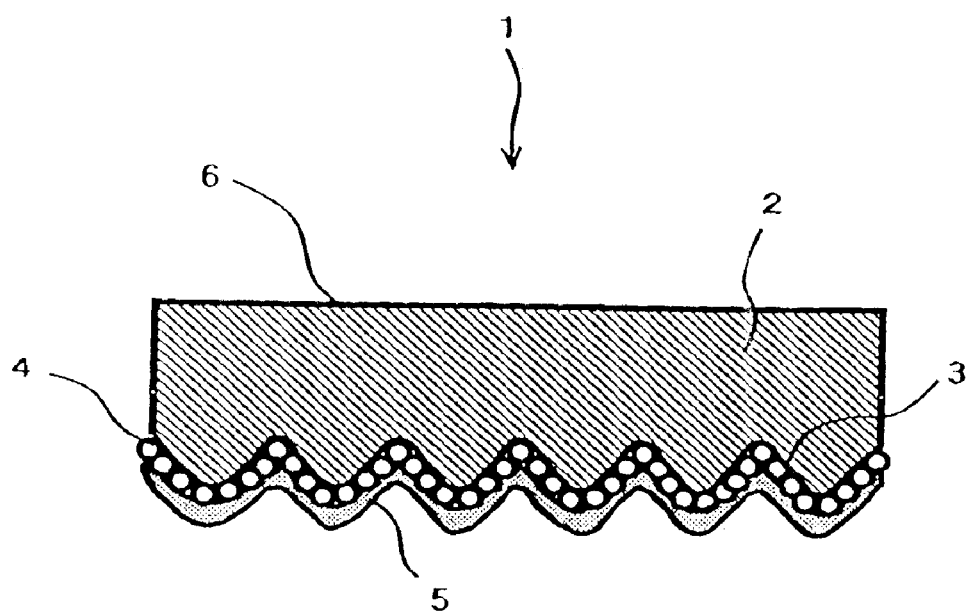
FIGS. 1 and 8 are schematic sectional views of copper foils for printed-wiring boards according to the present invention.

In claims is described a copper foil for printed-wiring board comprising on one side a nodular treatment side to be bonded to a substrate, characterized in that a nickel-zinc alloy layer is provided on the nodular treatment side. FIG. 1 is a schematic sectional view showing this copper foil for printed-wiring board.

Here, the description of "a nickel-zinc alloy layer is provided on the nodular treatment side" implies that nodular treatment is applied to one side of a copper foil 2, and then a nickel-zinc alloy layer 5 is formed on the surface obtained after the nodular treatment. The term "nodular treatment" used herein means a treatment for providing irregularities formed on the bonding side of the copper foil when the copper foil and the substrate are bonded together for producing a copper clad laminate. Formation of the irregularities is generally carried out by depositing copper microparticles 4 on the surface by electrolysis. The method can also be employed in which the one side of the copper foil layer 2 is etched, thereby providing only one side of the copper foil layer 2 with a matte face.

Then, the "nickel-zinc alloy layer" is formed on the side subjected to nodular treatment, whereby the selective etching property is ensured, and the heat resistance specified in UL 796 Standard (hereinafter referred to as "UL heat resistance" is ensured at the same time. The term "selective etching property" described in this specification is used to imply that only the copper component is dissolved, and nickel or a nickel-zinc alloy is not dissolved.
This selective etching property functions as a very useful property in the method of printed-wiring boards described later.

Up to this time, the concept of using nickel or a nickel-zinc alloy for surface treatment of the copper foil has been adopted for improving chemical resistance mainly in the sense that no damage is caused by chemical solutions used in the process of production of the printed-wiring board. As a result of conducting vigorous studies, the inventors of this invention have envisioned a certain method of producing printer-wiring plates, and considered that in the method, a protective layer for ensuring heat resistance could be left below the formed circuit even if the panel plating method or additive method is used. Thus, explanation will be presented showing the method of using this copper foil for printed-wiring board.

Figure 2:
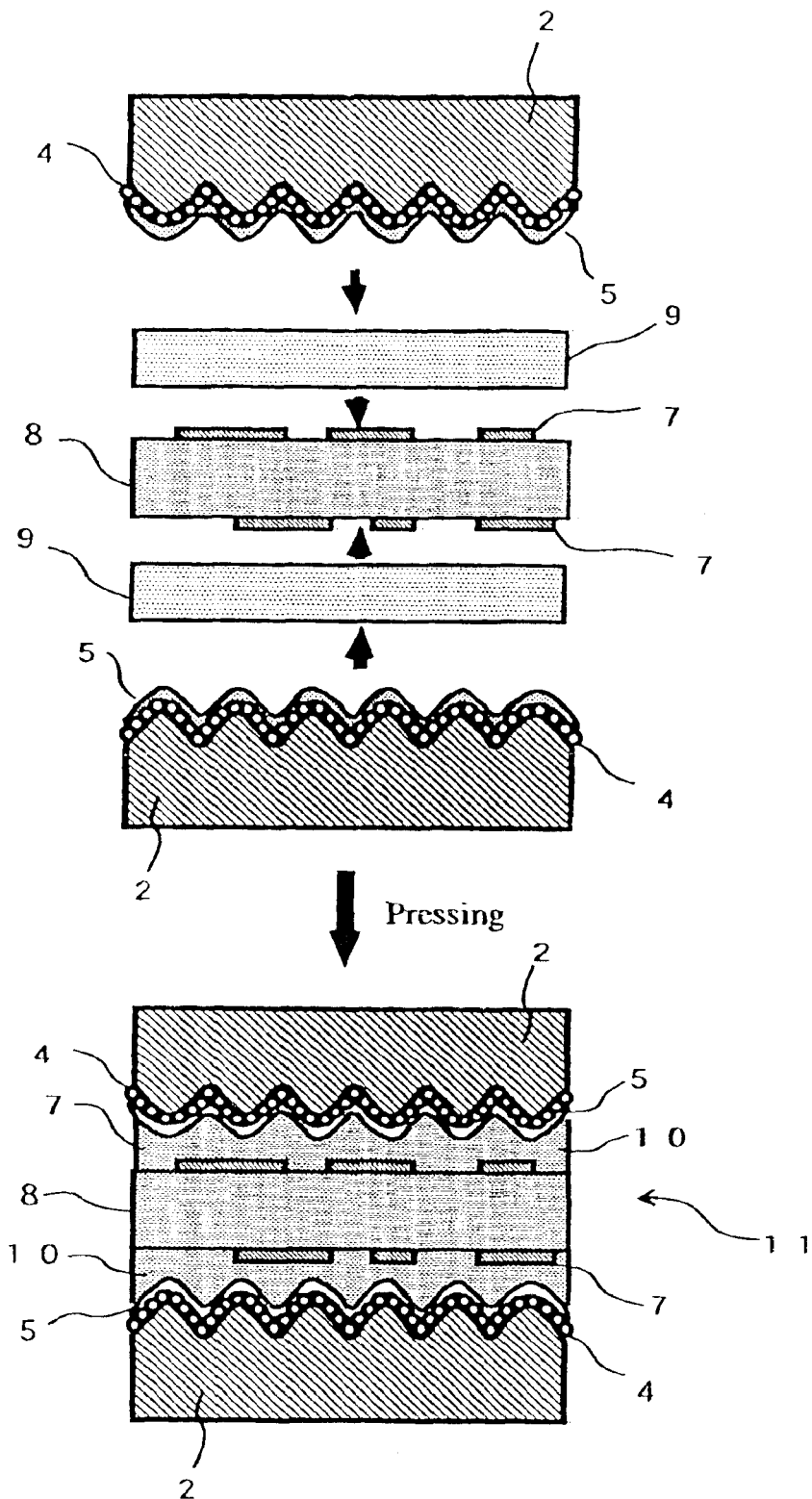
FIGS. 2 to 7 are each presented as a flow chart showing a process for producing a printed-wiring board that is used in the following description.

FIG. 2A shows a so called four-layer plate 11 in which a copper foil for printed-wiring board 1 according to this invention is bonded to the both outer faces of a core substrate 8 comprising an inner circuit 7, and shows therebelow a flow for subjecting this substrate to laser drilling processing to form a via hole 14 so as to produce a printed-wiring board 18 having a fine pitch pattern.

Figure 3:
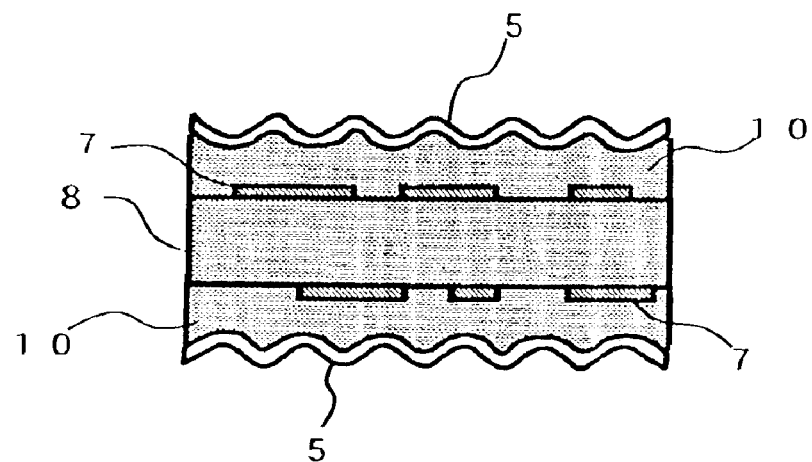
Figure 3:
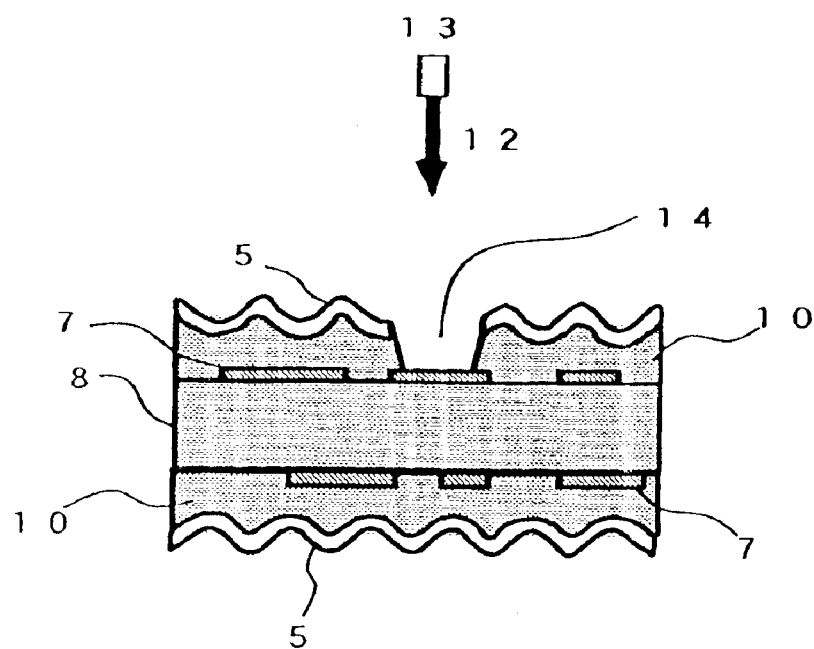

For the four-layer plate 11 shown in FIG. 2A, copper foil layers 2 on the both outer faces and the copper component of copper microparticles 4 are first etched away for carrying out laser drilling processing. At the time of etching them away, if an acid etchant such as a ferric chloride solution and copper sulfate based solution being a normal etchant for etching copper, the nickel-zinc alloy layer 5 as a surface treatment layer is also dissolved away along with the copper component, leading to a result similar to that when a conventional normal copper foil is used. However, if so called an alkali etchant or sulfuric acid-hydrogen peroxide based solution is used as an etchant for etching copper, the nickel or nickel-zinc alloy layer 5 remains without being dissolved, and the nickel or nickel-zinc alloy 5 appears on the both outer faces as shown in FIG. 3B.

The surface treatment applied to the matte side 3 of the copper foil layer 2 has never unnecessarily increased the amount of corrosion preventing elements except for the case where surface treatment is carried out using zinc or a zinc alloy for ensuring heat resistance. Therefore, the amount of deposited nickel or nickel alloy layer 5 is small, and the nickel or nickel alloy layer 5 is not found to remain on the surface of the substrate, and it can be said that all the layer is removed including the surface treatment layer. In the case of the present invention, however, the nickel or nickel alloy layer 5 should be made to remain in a recognizable way.

Then, in the case of the copper foil for printed-wiring board 1, its composition is also important. A nickel-zinc alloy has 70 to 88 wt % of nickel and the balance of zinc is preferably used for the nickel-zinc alloy. If the content of nickel in the nickel-zinc alloy is smaller than 70 wt %, the content of zinc increases, and it becomes impossible to carry out selective etching described above although UL heat resistance is more advantageously ensured. On the other hand, if the content of nickel in the nickel-zinc alloy exceeds 88 wt %, then the content of zinc decreases. In this case, even though the selective etching property is quite excellent, the UL heat resistance does not satisfy the value specified in the Standard.

Also, the thickness of the nickel-zinc alloy is very important. The copper foil for printed-wiring board is characterized in that the thickness of the nickel-zinc alloy is 0.07 g to 45 g per square meter of nodular treatment side of the copper foil. The thickness should be normally expressed using units for length such as $\mu$m, but the nodular treatment side of the copper foil has irregularities as apparent from FIG. 1, and copper microparticles are deposited thereon for obtaining an anchor effect when it is bonded to the substrate, thus making it difficult to use a unit for length. Thus, the deposited amount per square meter is used as a unit corresponding to the thickness of the nickel-zinc alloy layer.

The specific surface area of the nodular treatment side of a general copper foil varies depending on the thickness of the copper foil. Therefore, if the thickness of the nickel-zinc alloy layer is smaller than 0.7 g per square meter of nodular treatment side of the copper foil, stability is reduced in the sense that the nodular treatment side of the normally conceivable whole thickness of copper foil is covered uniformly and without irregularity. If the thickness of the nickel-zinc alloy layer exceeds 45 g per square meter, the irregularities for obtaining the anchor effect of the nodular treatment side of the normally conceivable whole thickness of copper foil may be eliminated or changed into a flat shape. Thus, the thickness derived as optimum conditions allowing the nickel-zinc alloy layer to be formed as a surface treatment layer for the nodular treatment side of the normally conceivable whole thickness of copper foil is 0.7 g to 45 g per square meter of nodular treatment side of the copper foil.

Then, a laser beam is applied to a predetermined location to carry out laser drilling processing. It is known that drilling processing with the use of a carbon dioxide gas is difficult if the copper foil exists. On the other hand, the inventors of this invention have recommended nickel as a material enabling drilling processing to be carried out quite easily. A theory demonstrating that the nickel layer or nickel alloy layer has excellent laser drilling processability has not yet been established. In the process of continuous studies, however, the inventors of this invention have come to believe that the laser drilling processability is improved based on the following principle.

When a metal is subjected to drilling processing by a laser, a process in which the metal is continuously vaporized in an amount corresponding to predetermined thickness of metal layer must be reproduced. In other words, during application of a laser, the temperature of at least the site to which the laser is applied must be higher than the boiling point of nickel or the nickel alloy. Copper that can hardly be subjected to laser drilling processing is an element classified as a precious metal belonging to the IB group of the periodic law, and has as its properties a melting point of 1083° C., a boiling point of 2582° C., and a melting enthalpy (heat of melting) of 13.3 kJ/mol under the condition of $1.01 \times 10^5$ Pa.

On the other hand, nickel is classified as an element belonging to the VIII group of the periodic law, and has as its properties a melting point of 1455° C., a boiling point of 2731° C., and a melting enthalpy (heat of melting) of 17.6 kJ/mol under the condition of $1.01 \times 10^5$ Pa. The boiling point of nickel is about 150 to 160° C. higher than the boiling point of copper. So far as these properties are concerned, nickel and the nickel alloy are more stable than copper with respect to heat. Therefore, drilling processing using a laser beam is carried out by providing high energy to the site exposed to the laser beam, thereby sharply increasing the temperature of the site to cause the material of the site to be melted and vaporized, and therefore it cannot be thought that the assumption that nickel and the nickel alloy are more easily drilled than copper holds.

Here, the thermal conductivity of copper is compared to that of nickel. Copper has thermal conductivity of 354 $W \cdot m^{-1} \cdot K^{-1}$ at 700° C., and is a good heat conductor. On the other hand, nickel has thermal conductivity of 71 $W \cdot m^{-1} \cdot K^{-1}$ at 700° C., which is approximately ⅕ of the thermal conductivity of copper, and it can be understood that nickel has very low heat conductivity compared to copper. In view of this fact, it can be considered that copper being a good heat conductor quickly diffuses heat given by the laser beam, thus making it difficult for concentrated heat to remain in one site. Then, it is also known that nickel has high absorptance for laser beams compared to copper. From these facts, it can be considered that because copper has low absorptance for laser beams, and heat energy supplied to the copper foil site exposed to the laser beam decreases causing heat given to the copper foil layer to be defused quickly, the temperature of the site in the copper foil exposed to laser beam hardly rises above the boiling point to reduce laser drilling processability.

Nickel conducts heat at a rate about ⅕ of the heat conductivity of copper. Also, because of its high absorptance for laser beams, nickel has a high efficiency of conversion to heat energy compared to copper. Therefore, it can be considered that heat energy is easily concentrated on the site exposed to the laser beam, and the speed at which heat energy is supplied by the laser beam than the speed at which heat is diffused, and the site exposed to the laser beam easily reaches the melting point of nickel, thus improving laser drilling processability. If the aforementioned absorptance for laser beams is compared for copper and nickel having same levels of surface roughness, the reflectivity of nickel is apparently smaller than that of copper by about 1% to 2%, and thus the absorptance for laser beams by nickel is higher.

As a result, it can be considered that nickel undergoes quick temperature rising by application of a laser beam, and is easily melted and vaporized in spite of the fact that its melting point is higher than that of copper. Therefore, a similar result can be obtained if a nickel-zinc alloy having the composition mentioned in the present invention, existence of the alloy layer on the outer face of the substrate does not hinder at all laser drilling processability. FIG. 3C shows a situation in which laser drilling processing is carried out to form the via hole 14, and desmear treatment is carried out.

Here, what is brought about as another effect is that a solution capable of dissolving the resin of the insulation resin layer is used for the solution of desmear treatment, and therefore it vanishes even irregularities on the outer face of the substrate, thus reducing the adhesion to the substrate of a copper layer subsequently formed by the plating method or the like. If using copper foil for printed-wiring board according to present invention, however, irregularities on the outer face of the substrate remain intact so that the anchor effect can be obtained because the nickel-zinc alloy layer exists on the outermost layer, thus making it possible to improve adhesion between the plated layer and the substrate.

Figure 4:
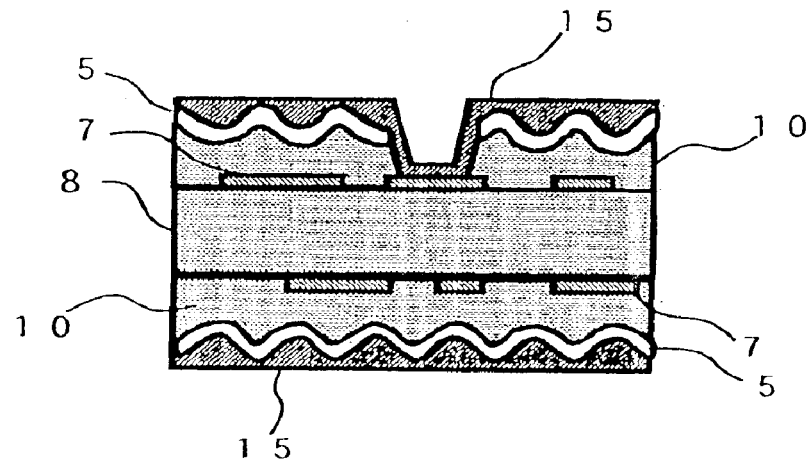
Figure 4:
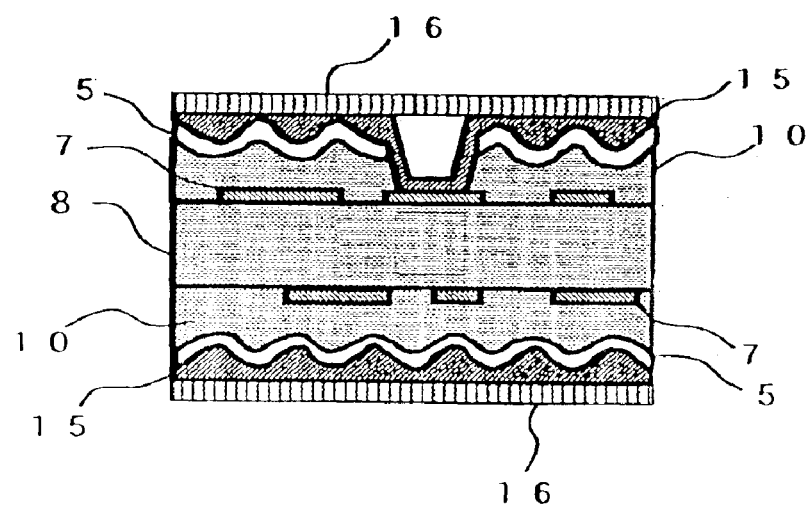
Figure 5:
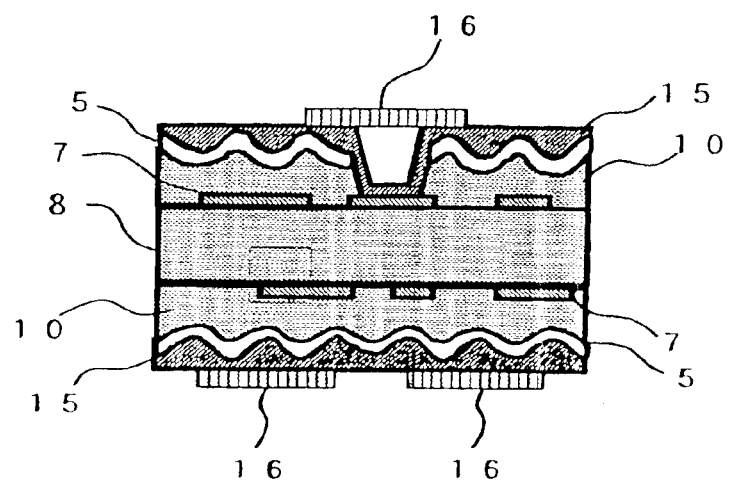
Figure 5:
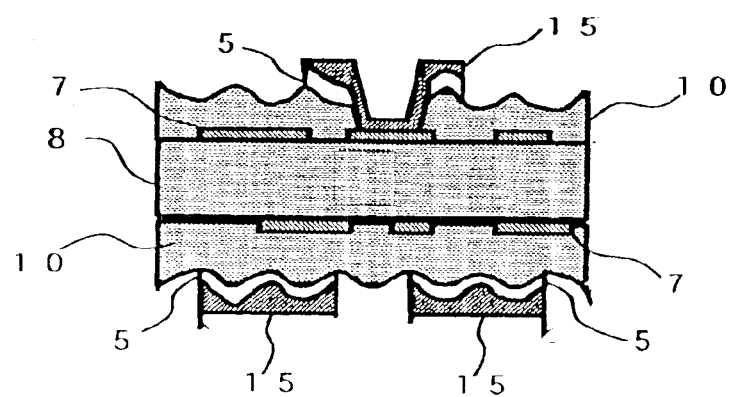

From this point, a copper plated layer is formed on the entire surface of the substrate including the inner wall of the via hole 14 in the case of the plating method, as shown in FIG. 4D. Then, as shown in FIG. 4E, an etching resist layer 16 is formed on the surface of the copper plated layer 15, and as shown in FIG. 5F, a circuit pattern is developed by light exposure on the etching resist layer 16, and a acid etchant for copper is used to carry out circuit etching, and the etching resist is peeled off to obtain the printed-wiring board 18 as shown in FIG. 15G. If the above described production method is adopted, the nickel-zinc layer 5 exists in the interface between the circuit on the outer face and the substrate, thus making it possible to obtain a plate having excellent UL heat resistance.

Figure 6:
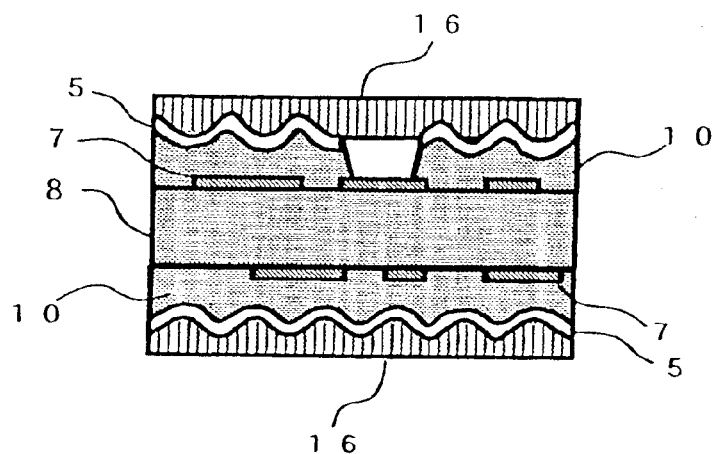
Figure 6:
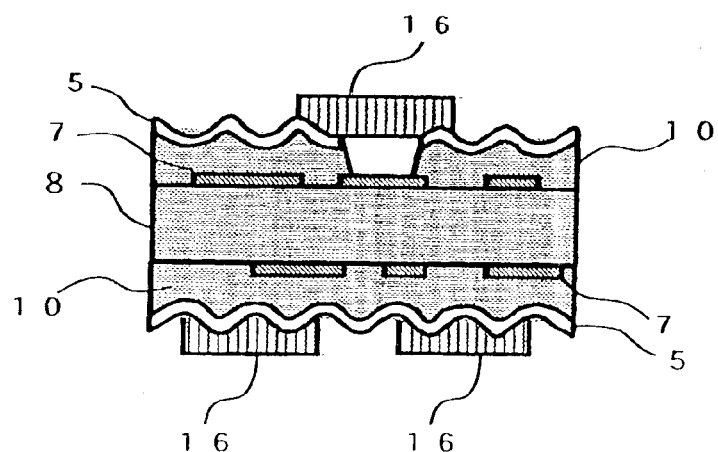
Figure 7:
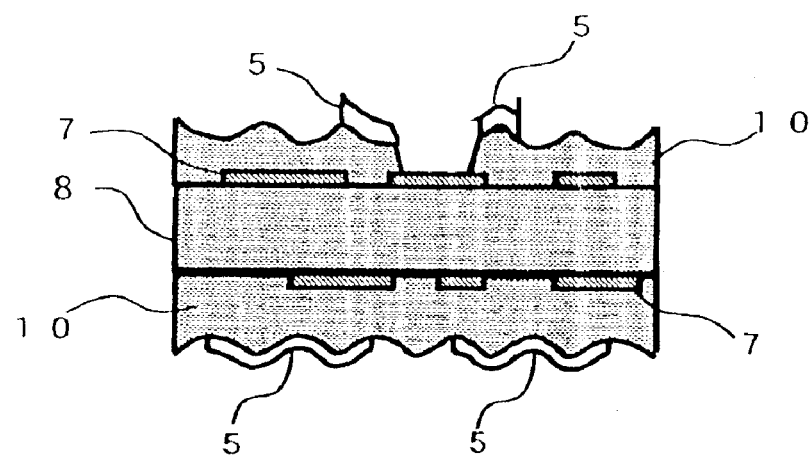
Figure 7:
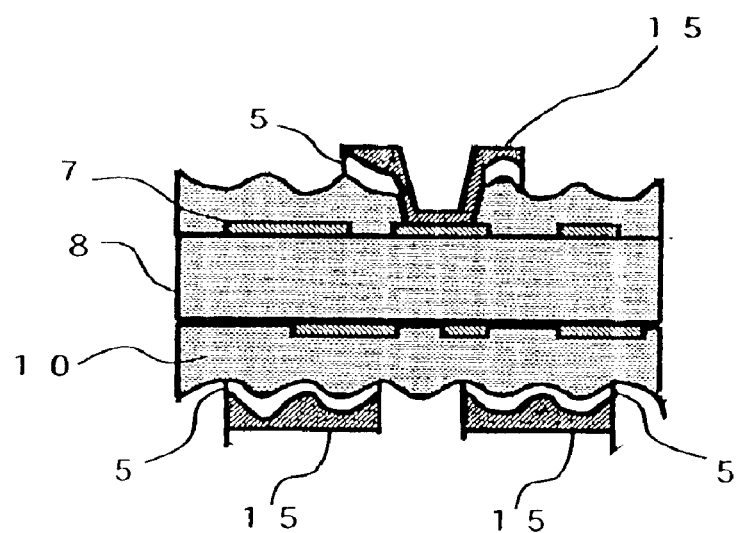

When the semiadditive method is adopted, on the other hand, the following flow is applied. For the plate shown in FIG. 3C that has been subjected to laser drilling processing to form the shape of the via hole 14 and has undergone desmear treatment, the etching resist layer 16 is formed on the surface of the exposed nickel-zinc layer 5 as shown in FIG. 6D without forming a plated layer, a circuit pattern is developed by light exposure on the etching resist layer 16 as shown in FIG. 6E, the nickel-zinc layer 5 is etched into a circuit shape using an etchant, and the etching resist is peeled off to provide a situation shown in FIG. 7F. Then, the copper plated layer 15 is formed on the nickel-zinc layer 5 shaped like a circuit and on the inner wall of the via hole 14, whereby the printed-wiring board 18 as shown in FIG. 7G can be obtained. Adoption of this production method makes it possible to obtain a plate having excellent UL heat resistance in which the nickel-zinc layer 5 exists in the interface between the circuit and the substrate in a same way as FIG. 5G.

If assuming the uses described above, a copper foil in which a surface treatment layer capable of undergoing selective etching with copper is provided, and the UL heat resistance of the surface treatment layer is excellent is required. Therefore, a copper foil having those properties together is the copper foil for printed-wiring board defined in claims. Furthermore, all the copper foils can be formed into copper clad laminates, and processed into printed-wiring boards by normal etching process, and in this case, excellent UL heat resistance is also ensured.

Figure 8:
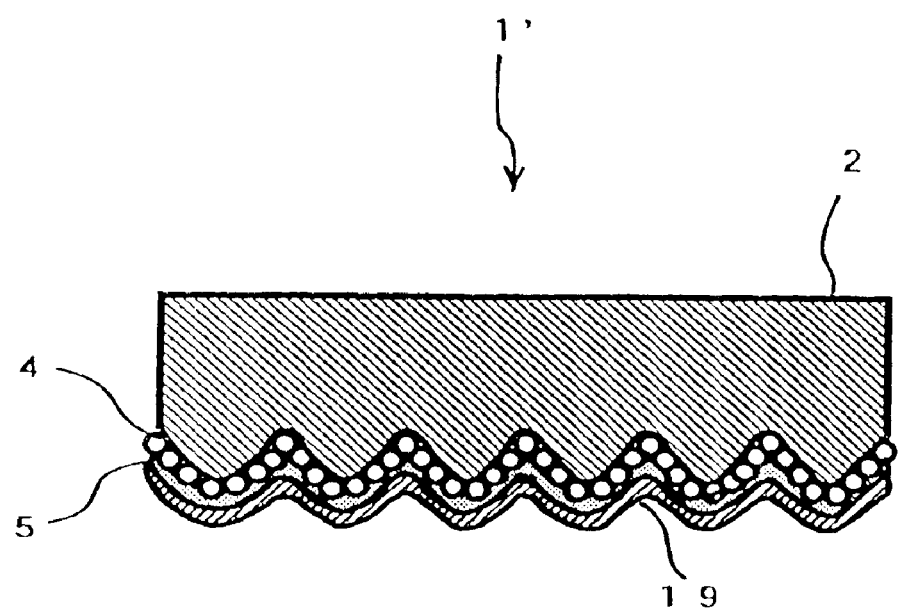

In addition, a copper foil having a similar effect is the copper foil for printed-wiring board comprising on one side a nodular treatment side to be bonded to a substrate according to another claim, characterized in that a nickel layer is provided on the nodular treatment side, and a zinc layer or a zinc alloy layer is provided on the nickel layer. FIG. 8 shows a schematic sectional view of this copper foil. As apparent from FIG. 8, the nickel layer 5 is provided on the nodular treatment side, and a zinc layer or a zinc alloy layer 19 typically of brass or the like is provided on the nickel layer 5 as a surface treatment layer. The nickel layer 5 serves to protect the zinc layer or zinc alloy layer 19 typically of brass provided for the purpose of ensuring UL heat resistance when the copper component of the copper foil is subjected to selective etching with respect to the four-layer plate 11 shown in FIG. 2A.

Therefore, uses similar to those of the copper foils described above can be adopted for this copper foil for printed-wiring board, and the printed-wiring board obtained by a production method similar to those described above allows a fine pitch circuit to be easily formed, and enables a circuit having UL heat resistance to be provided.

For this copper foil for printed-wiring board, however, the nickel layer and the surface treatment layer dependently of each other, and therefore unless the total thickness of the nickel layer and surface treatment layer formed on the nodular treatment side of the copper foil is considered, irregularities on the nodular treatment side are vanished, and the anchor effect of the plated layer can no longer be obtained when the copper foil is processed into the printed-wiring board. Thus, the present invention provides a copper foil for printed-wiring board in which the weight thickness (X) of the nickel layer is in the range of from 0.7 g/m² to 45 g/m², the weight thickness (Y) of the zinc layer is in the range of from 0.01 g/m² to 2 g/m², and the reduced thickness (T) calculated from Equation 1 is smaller than or equal to 5 μm, and provides a copper foil for printed-wiring board in which the weight thickness (X) of the nickel layer is in the range of from 0.7 g/m² to 45 g/m², the weight thickness (Z) of the zinc alloy layer containing n kinds of alloying elements is in the range of from 0.01 g/m2 to 2 g/m2, and the reduced thickness (T) calculated in accordance with the procedure shown in Equation 2 is smaller than or equal to 5 μm, thereby specifying their appropriate thickness. The nickel layer has a minimum thickness of 0.7 g/m² for achieving a uniform and defect-free thickness in consideration of the selective etching property. At this time, the minimum necessary thickness of the zinc layer or zinc alloy layer required for conforming to the Standard of UL heat resistance is 0.01 g/m². Thus, the reason why the expression has been used such that the total thickness is "smaller than or equal to 5 μm" is that the lower limit of total thickness is spontaneously determined from the minimum necessary value in the range of weight thickness of nickel, zinc or the zinc alloy.

Unless the total thickness of the nickel layer and the zinc layer or the zinc alloy layer is considered, irregularities on the nodular treatment side of the copper foil are vanished, and adhesion of the copper foil can no longer be ensured when the copper foil is processed into the copper clad laminate. As described previously, because irregularities are provided on the nodular treatment side of the copper foil, it is difficult to express the thickness using gage thickness of the nickel layer and the zinc layer, and thus weight thickness is usually used. Thus, the total thickness of the nickel layer and the zinc layer or the zinc alloy layer is considered using this weight thickness.

However, the concept of total thickness is different for the case of combination of the nickel layer and zinc layer in the nodular treatment side of the copper foil and the case of combination of the nickel layer and zinc alloy layer in the nodular treatment side of the copper foil.

First, the thickness in the case of combination of the nickel layer and zinc layer in the nodular treatment side of the copper foil is considered in the following manner. In reality, however, it is difficult to calculate correct thickness in a plane surface having small irregularities, and therefore the thickness is reduced into a value that would be determined for a flat surface with experimental empirical values taken into consideration. Here, the Ni layer is formed in thickness of X (g) per square meter, and its reduced thickness equals X/8.85 (μm) provided that the specific gravity of nickel is 8.85 g/m³. If the Zn layer is formed on the nickel layer in thickness of Y (g) per square meter, then its thickness equals Y/7.12 (μm). Therefore, the total thickness of the Ni layer and zinc layer equals (X/8.85)+(Y/7.12) (μm).

Next, the thickness in the case of combination of the nickel layer and zinc alloy layer in the nodular treatment side of the copper foil is considered in the following manner. Here, the zinc alloy is considered as an alloy of Zn and n kinds of different metals. It is considered that the zinc alloy is deposited in thickness of Z (g) per square meter. Then, assume that the content of zinc in the zinc alloy is a % by weight, and the contents of constituent elements of n kinds of different metals ($Me_1, Me_2, \ldots, Me_n$) are $b_1\%$ by weight, $b_2\%$ by weight, ..., $b_n\%$ by weight, respectively. That is, the equation of a $+(b_1+b_2+ \ldots +b_n)=100$ wt % holds. Then, the specific gravity $\rho_{sum}$ of the alloy is given by equation 3.

$$\rho_{sum} = \frac{\{7.12 \times a + (\rho_{Me1} \times b_1 + \rho_{Me2} \times b_2 + \ldots + \rho_{Men} \times b_n)\}}{100}. \quad \text{Equation 3}$$

Therefore, the reduced thickness of the zinc alloy layer is considered as $X/\rho_{sum}$ (μm). From these considerations, the total thickness of the nickel layer and the zinc alloy layer is calculated as $(X/8.85)+(Z/\rho_{sum})$ (μm).

Experience shows if the reduced total thickness described above is larger than 5μ, irregularities on the nodular treatment side of the copper foil are vanished. On the other hand, even if the thickness of the nickel layer is larger than 45 g/m², it contributes neither to improvement of the selective etching property nor to stability of thickness. In addition, nickel is expensive, and therefore it is desired that the amount of nickel to be used is reduced wherever possible. For these reasons, the upper limit of weight thickness (X) of the nickel layer is 45 g/m². When the upper limit of thickness of the nickel layer is determined, the upper limit of thickness of the zinc layer or zinc alloy layer required for satisfying the conditions of total thickness described above is inevitably determined.

The copper foil for printed-wiring board described above exhibits its properties advantageously particularly in the uses as described above, but is also capable of adapting to other uses similar to those of usual copper foils, and the printed-wiring board obtained from the copper clad laminate produced using the copper foil for printed-wiring board has excellent UL heat resistance. Thus, one aspect of the present invention provides a copper clad laminate using the copper foil for printed-wiring board wherein the copper clad laminate includes the concepts of both rigid type and flexible type, and covers any layer structures of single-sided, double-sided and multilayered structures.

BEST MODE FOR CARRYING OUT THE INVENTION

The results of producing a copper foil for printed-wiring board according to the present invention, producing a multilayer printed-wiring board, and measuring UL heat resistance will be described below.

EXAMPLE 1

In this Example, the steps of producing a printed-wiring board using a copper foil for printed-wiring board comprising an alloy layer of nickel and zinc on the matte side of an electrodeposited copper foil will be described. First, production of the copper foil for printed-wiring board 1 will be described with reference to the drawings. Here, an electrodeposited copper foil having a cross section shown schematically in FIG. 1 for use in producing a copper foil having nominal thickness of 18 μm, which had not been subjected to surface treatment (hereinafter referred to as "untreated copper foil") was used. Then, a so called surface treatment apparatus was used to subject this untreated copper foil 2 to nodular treatment and surface treatment for forming the nickel-zinc layer.

In the surface treatment apparatus, copper microparticles 4 are first deposited on the surface of the matte side 3 of the untreated copper foil 2 under burnt copper plating conditions. For the burnt copper plating conditions for the copper microparticles 4, plating was carried out under conditions of current density of 30 A/dm$^2$ and electrolysis time of 4 seconds by using an insoluble anode (DSE) for the counter electrode to make the copper foil itself undergo cathode polarization, in a copper sulfate solution at a liquid temperature of 30° C. with concentrations of copper and sulfuric acid being 12 g/l and 180 g/l, respectively.

Then, the nickel-zinc alloy layer 5 was formed on the surface with the copper microparticles 4 provided thereon. For this nickel-zinc alloy layer 5, a pyrophosphate based solution was prepared with the use of zinc pyrophosphate ($ZnP_2O_7 \cdot 3H_2O$), nickel sulfate ($NiSO_4 \cdot 7H_2O$) and potassium pyrophosphate ($K_2P_4O_7$) so that the solution had a composition with 1.0 g/l of zinc, 10.0 g/l of nickel and 100 g/l of potassium pyrophosphate, and in the solution at a liquid temperature of 30° C., the copper foil itself was made to undergo cathode polarization with the use of a stainless plate for the counter electrode under conditions of current density of 1 A/dm$^2$ and electrolysis time of 300 seconds, thereby providing an alloy composition with 2.28 g/m$^2$ (70.1 wt %) of nickel and 0.95 g/cm$^2$ (29.9 wt %) of zinc. The weight thickness of the nickel-zinc alloy layer 5 was 3.23 g/m$^2$. In concurrence with this formation of the nickel-zinc alloy layer 5 on the nodular treatment side 4, 0.10 g/m$^2$ of nickel-zinc layer was formed on the shiny side 6 of the untreated copper foil 2 as a corrosion prevention layer. In addition, the surface with the nickel-zinc alloy layer 5 formed thereon was treated with a silane coupling agent and then dried to produce the copper foil for printed-wiring board 1 shown in FIG. 1. However, the nickel-zinc alloy layer 5 formed on the surface of the shiny side 6, and the silane coupling agent treated layer are not shown in the drawings.

The steps of producing a printed-wiring board using the copper foil for printed-wiring board obtained in the above described steps will be described below referring to FIGS. 2 to 5. The copper foil for printed-wiring board 1 according to the present invention was bonded to the both outer faces of a core substrate 8 comprising an inner circuit 7 with an insulation layer 10 formed wit the use of a prepreg 9 under usual hot press conditions, and thereby a so called four-layer plate 11 shown in FIG. 2A was produced.

Then, for the four-layer plate 11 shown in FIG. 2A, the copper component of the untreated copper foil 2 and the copper microparticles 4 on the both outer faces were first etched away for carrying out laser drilling processing. At the time when the copper component was etched away, "A" process solution (manufactured by Meltex Co., Ltd.) being so called an alkali etchant was used as a etchant for copper, thereby allowing the nickel-zinc alloy layer 5 to be exposed at the both outer faces as shown in FIG. 3B with the nickel-zinc alloy layer 5 remaining without being dissolved.

Then, a laser beam 12 was applied to a predetermined location to carry out drilling processing to bore a via hole 14 with a carbon dioxide laser 13. For the irradiation conditions of the carbon dioxide laser 13, the frequency was 2000 Hz, the mask diameter was 5.0 mm, the pulse width was 60 μsec., the pulse energy was 16.0 mJ, the offset was 0.8 and the laser beam diameter was 140 μm, so that a process diameter of 110 μm was provided. At this time, even if the nickel-zinc alloy layer 5 existed, drilling processability was not compromised at all, but rather a satisfactory via hole shape could be provided. Thereafter, desmear treatment was carried out to smooth the inner surface of the via hole 14 and remove remainders such as resin remaining on the bottom of the via hole 14, thereby providing a situation shown in FIG. 3C.

In addition, as an effect obtained in a overlapping way, it could be ensured that due to a solution for desmear treatment, the resin of the insulation layer 10 is prevented from being dissolved, and irregularities on the outer face of the plate are not vanished, because of existence of the nickel-zinc alloy layer 5 on the outermost layer. This is effective in the sense that adhesion to the substrate of the plated layer formed in the subsequent step is improved.

Here, the panel plating method was used to form a copper plated layer 15 with average thickness of 15 μm on the entire surface of the substrate including the inner surface of the via hole 14. For copper plated conditions at this time, a copper sulfate solution was used with concentrations of sulfuric acid and copper being 150 g/l and 65 g/l, respectively, and with liquid temperature of 45° C., current density of 15 A/dm$^2$ and electrolysis time of 140 seconds. Then, an etching resist layer 16 was formed on the surface of the copper plated layer 15 with the use of a dry film as shown in FIG. 4E, and a circuit pattern was developed through light exposure on the etching resist layer 16 as shown in FIG. 5F, and an acid etchant for copper was used to carry out circuit etching, and the etching resist layer 16 was peeled to obtain a printed-wiring board 18 with an outer circuit 17 as shown in FIG. 5G.

The printed-wiring board 18 obtained as described above was used to measure the peel strength at the interface between the outer circuit 17 and the isolation layer 10. As a result, the dry peel strength was 1.89 kgf/cm, and the level of UL heat resistance at rating 130° C. defined in the UL 796 Standard was 0.85 kgf/cm, both well surpassing the values (10 days) specifying the UL standard.

EXAMPLE 2

In this Example, the steps of producing a printed-wiring board with the use of a copper foil for printed-wiring board comprising an alloy layer of nickel and zinc on the matte side of an electrodeposited copper foil will be described. First, production of the copper foil for printed-wiring board 1 will be described with reference to the drawings. Here, an electrodeposited copper foil having a cross section shown schematically in FIG. 1 for use in producing a copper foil having nominal thickness of 18 μm, which had not been subjected to surface treatment (hereinafter referred to as "untreated copper foil") was used. Then, a so called surface treatment apparatus was used to subject this untreated copper foil 2 to nodular treatment and surface treatment for forming the nickel-zinc layer.

In the surface treatment apparatus, copper microparticles 4 are first deposited on the surface of the matte side 3 of the untreated copper foil 2 under burnt copper plating conditions, and seal plating was carried out as level copper plating conditions so as to prevent the copper microparticles 4 from being dropped off, thereby depositing stably the copper microparticles 4 on the matte side 3 of the untreated copper foil 2. For the burnt copper plating conditions for the copper microparticles 4, plating was carried out under conditions of current density of 30 A/dm$^2$ and electrolysis time of 4 seconds by using an insoluble anode (DSE) for the counter electrode to make the copper foil itself undergo cathode polarization, in a copper sulfate solution at a liquid temperature of 30° C. with concentrations of copper and sulfuric acid being 12 g/l and 180 g/l, respectively. For the level copper plating conditions for the copper microparticles 4, plating was carried out under conditions of current density of 15 A/dm$^2$ and electrolysis time of 4 seconds with the use of a stainless plate for the counter electrode to make the copper foil itself undergo cathode polarization, in a copper sulfate solution at a liquid temperature of 30° C. with concentrations of copper and sulfuric acid being 40 g/l and 180 g/l, respectively.

Then, the nickel-zinc alloy layer 5 was formed on the surface with the copper microparticles 4 provided thereon. For this nickel-zinc alloy layer 5, a pyrophosphate based solution was prepared using zinc pyrophosphate ($ZnP_2O_7 \cdot 3H_2O$), nickel sulfate ($NiSO_4 \cdot 7H_2O$) and potassium pyrophosphate ($K_2P_4O_7$) so that the solution had a composition with 0.2 g/l of zinc, 2.3 g/l of nickel and 100 g/l of potassium pyrophosphate, and in the solution at a liquid temperature of 30° C., the copper foil itself was made to undergo cathode polarization using a stainless plate for the counter electrode under conditions of current density of 2 $A/dm^2$ and electrolysis time of 150 seconds, thereby providing an alloy composition with 0.76 $g/m^2$ (76.0 wt %) of nickel and 0.24 $g/cm^2$ (24.0 wt %) of zinc. The weight thickness of the nickel-zinc alloy layer at this time was 1.00 $g/m^2$. In concurrence with this formation of the nickel-zinc alloy layer 5 on the matte side 3, 0.10 $g/m^2$ of nickel-zinc layer was formed on the shiny side 6 of the untreated copper foil 2 as a corrosion prevention layer. In addition, the surface with the nickel-zinc alloy layer 5 formed thereon was treated with a silane coupling agent and then dried to produce the copper foil for printed-wiring board 1 shown in FIG. 1. However, the nickel-zinc alloy layer 5 formed on the surface of the shiny side 6, and the silane coupling agent treated layer are not shown in the drawings.

Thereafter, the printed-wiring board 18 was produced through a method similar to that used in Example 1, comprised of the steps shown in FIGS. 2 to 5. This printed-wiring board 18 was used to measure the peel strength at the interface between the outer circuit 17 and the isolation layer 10. As a result, the dry peel strength was 1.89 kgf/cm, and the level of UL heat resistance at rating 130° C. defined in the UL 796 Standard was 1.15 kgf/cm, both well surpassing the values (10 days) specifying the UL standard.

EXAMPLE 3

In this Example, the steps of producing a printed-wiring board using a copper foil for printed-wiring board comprising two layers, namely nickel and zinc layers on the nodular treatment side of an electrodeposited copper foil will be described. First, production of the copper foil for printed-wiring board 1 will be described with reference to the drawings. Here, an electrodeposited copper foil having a cross section shown schematically in FIG. 8 for use in producing a copper foil having nominal thickness of 18 μm, which had not been subjected to surface treatment (hereinafter referred to as "untreated copper foil") was used. Then, a so called surface treatment apparatus was used to subject this untreated copper foil 2 to nodular treatment and surface treatment for forming the nickel and zinc layers.

In the surface treatment apparatus, copper microparticles 4 are first deposited on the surface of the matte side 3 of the untreated copper foil 2 under burnt copper plating conditions, and seal plating was carried out as level copper plating conditions so as to prevent the copper microparticles 4 from being dropped off, thereby depositing stably the copper microparticles 4 on the matte side 3 of the untreated copper foil 2. For the burnt copper plating conditions for the copper microparticles 4, plating was carried out under conditions of current density of 30 $A/dm^2$ and electrolysis time of 4 seconds by using an insoluble anode (DSE) for the counter electrode to make the copper foil itself undergo cathode polarization, in a copper sulfate solution at a liquid temperature of 30° C. with concentrations of copper and sulfuric acid being 40 g/l and 180 g/l, respectively. For the level copper plating conditions for the copper microparticles 4, plating was carried out under conditions of current density of 15 $A/dm^2$ and electrolysis time of 4 seconds by using the insoluble anode (DSE) for the counter electrode to make the copper foil itself undergo cathode polarization, in a copper sulfate solution at a liquid temperature of 30° C. with concentrations of copper and sulfuric acid being 12 g/l and 180 g/l, respectively.

Then, a nickel layer 5 was formed on the surface with copper microparticles 4 provided thereon. For this nickel layer 5, a nickel sulfate based solution was prepared so that the solution had a composition with 300 g/l of nickel sulfate ($NiSO_4 \cdot 7H_2O$), 50 g/l of nickel chloride ($NiCl_2$) and 40 g/l of boric acid ($H_3BO_3$), and in the solution at a liquid temperature of 30° C., the copper foil itself was made to undergo cathode polaraization with the use of a stainless plate for the counter electrode under conditions of current density of 24 $A/dm^2$ and electrolysis time of 12.6 seconds, thereby electro-depositing 8.24 $g/m^2$ of nickel.

Subsequently, a zinc layer 19 was formed on the surface of the nickel layer 5. With a solution having concentrations of zinc and potassium pyrophosphate being 6 g/l and 100 g/l, respectively, the copper foil itself was made to undergo cathode polarization with the use of a stainless plate for the counter electrode in the solution at a liquid temperature of 25° C. under conditions of current density of 6 $A/dm^2$ and electrolysis time of 2 seconds, thereby electrodepositing 0.20 $g/m^2$ of zinc.

The reduced thickness of the nickel layer 5 and the zinc layer 19 is 0.96 μm (0.96 +zinc) from Equation 1. In concurrence with this formation of this zinc layer 19, 0.02 $g/m^2$ of zinc layer was formed on the shiny side 6 of the untreated copper foil 2 as a corrosion prevention layer. In addition, the surface with the zinc layer 5 formed thereon was treated with a silane coupling agent and then dried to produce the copper foil for printed-wiring board 1 shown in FIG. 8. However, the zinc layer formed on the surface of the shiny side 6, and the silane coupling agent treated layer are not shown in the drawings.

Thereafter, the printed-wiring board 18 was produced by a method similar to that used in Example 1, comprised of the steps shown in FIGS. 2 to 5. This printed-wiring board 18 was used to measure the peel strength at the interface between the outer circuit 17 and the isolation layer 10. As a result, the dry peel strength was 1.89 kgf/cm, and the level of UL heat resistance at rating 130° C. defined in the UL 796 Standard was 1.15 kgf/cm, both well surpassing the values (10 days) specifying the UL standard.

EXAMPLE 4

Here, the case where the additive method was adopted for forming the outer circuit 17 will be described. Thus, the steps shown in FIGS. 2A to 3C are similar to those of Example 1. Therefore, in order to prevent redundancy, such steps will not be described here. Also, for the symbols in the drawings, common symbols will be used wherever possible. The subsequent steps proceeds in accordance with the following flow. The etching resist layer 16 was formed as shown in FIG. 6D on the surface of the exposed nickel-zinc alloy layer 5 of a substrate subjected to laser drilling processing shown in FIG. 3C to provide a via hole shape therein, and made to undergo desmear treatment, and a circuit pattern was developed by light exposure on the etching resist layer 16, and an etchant was used to etch the nickel-zinc alloy layer 5 in a circuit shape as shown in FIG. 7F, and the remaining etching resist layer 16 was peeled off, thereby leaving only the nickel-zinc alloy layer 5 on the site forming the outer circuit 17.

Then, a copper plated layer having average thickness of 15 μm was formed on the nickel-zinc alloy layer 5 shaped into a circuit and on the inner wall of the via hole, thereby obtaining a printed-wiring board as shown in FIG. 7G. The copper plating was carried out by first catalyzing palladium and forming a copper layer with thickness of 1 μm to 2 μm by electroless copper plating, followed by carrying out electrolysis copper plating under conditions of current density of 15 A/dm$^2$ with a copper sulfate solution at a liquid temperature of 45° C. having concentrations of sulfuric acid of 150 g/l and copper of 65 g/l.

The printed-wiring board 18 obtained as described above was used to measure the peel strength at the interface between the outer circuit 17 and the isolation layer 10. As a result, the dry peel strength was 1.76 kgf/cm, and the level of UL heat resistance at rating 130° C. defined in the UL 796 Standard was 1.03 kgf/cm, both well surpassing the values (10 days) specifying the UL standard.

COMPARATIVE EXAMPLE 1

In this Comparative Example 1, the copper foil for printed-wiring board 1 was produced in a method similar to that of Example 1 for producing the printed-wiring board 18 in a similar way.

However, the composition of nickel and zinc in the nickel-zinc alloy layer 5 was purposely deviated from the range according to the present invention in which the content of nickel is 70 to 88 wt % and the content of zinc is the balance. Thus, for this nickel-zinc alloy layer 5, a pyrophosphate based solution was prepared using zinc pyrophosphate ($ZnP_2O_7 \cdot 3H_2O$), nickel sulfate ($NiSO_4 \cdot 7H_2O$) and potassium pyrophosphate ($K_2P_4O_7$) so that the solution had a composition with 1.0 g/l of zinc, 1.5 g/l of nickel and 100 g/l of potassium pyrophosphate, and in the solution at a liquid temperature of 30° C., the copper foil itself was made to undergo cathode polaraization with the use of a stainless plate for the counter electrode under conditions of current density of 1 A/dm$^2$ and electrolysis time of 300 seconds, thereby providing an alloy composition with 1.14 g/m$^2$ (59.1 wt %) of nickel and 0.79 g/cm$^2$ (40.9 wt %) of zinc. The weight thickness of the nickel-zinc alloy layer 5 was 1.93 g/m$^2$. In concurrence with this formation of the nickel-zinc alloy layer 5 on the nodular treatment side 4, 0.10 g/m$^2$ of nickel-zinc layer was formed on the shiny side 6 of the untreated copper foil 2 as a corrosion prevention layer.

Then, in the process of production of the printed-wiring board 18, the untreated copper foil 2 on the both outer faces and the cupper component of the copper microparticles 4 were first etched away for carrying out laser drilling processing for the four-layer plate 11 shown in FIG. 2A, but when they were etched away, the nickel-zinc alloy layer 5 having the above described composition was dissolved because the content of nickel in the nickel-zinc alloy layer 5 was low even if A process solution (manufactured by Meltex Co., Ltd.) being so called an alkali etchant was used as a etchant for copper, thus making it impossible to conduct selective etching. As a result, the nickel-zinc alloy layer 5 located on the both outer faces in FIG. 3B was removed, and therefore the printed-wiring board 18 could not be produced by a method similar to that of Example 1.

COMPARATIVE EXAMPLE 2

In this Comparative Example 2, the copper foil for printed-wiring board 1 was produced in a method similar to that of Example 1 to produce the printed-wiring board 18 in a similar way.

However, the composition of nickel and zinc in the nickel-zinc alloy layer 5 was purposely deviated from the range according to the present invention in which the content of nickel is 70 to 88 wt % and the content of zinc is the balance. Thus, for this nickel-zinc alloy layer 5, a pyrophosphate based solution was prepared using zinc pyrophosphate ($ZnP_2O_7 \cdot 3H_2O$), nickel sulfate ($NiSO_4 \cdot 7H_2O$) and potassium pyrophosphate ($K_2P_4O_7$) so that the solution had a composition with 0.6 g/l of zinc, 10.0 g/l of nickel and 100 g/l of potassium pyrophosphate, and in the solution at a liquid temperature of 30° C., the copper foil itself was made to undergo cathode polaraization with the use of a stainless plate for the counter electrode under conditions of current density of 0.8 A/dm$^2$ and electrolysis time of 6000 seconds, thereby providing an alloy composition with 7.74 g/m$^2$ (90.0 wt %) of nickel and 0.86 g/cm$^2$ (10.0 wt %) of zinc. The weight thickness of the nickel-zinc alloy layer 5 was 8.60 g/m$^2$. In concurrence with this formation of the nickel-zinc alloy layer 5 on the nodular treatment side 4, 0.02 g/m$^2$ of nickel-zinc layer was formed on the shiny side 6 of the untreated copper foil 2 as a corrosion prevention layer.

Then, in the process of production of the printed-wiring board 18, the untreated copper foil 2 on the both outer faces and the cupper component of the copper microparticles 4 were first etched away for carrying out laser drilling processing for the four-layer plate 11 shown in FIG. 2A. When they were etched away. A process solution (manufactured by Meltex Co., Ltd.) being so called an alkali etching solution was used as an etchant for copper, whereby the nickel-zinc alloy layer 5 remained without being dissolved, thus making it possible to leave the nickel-zinc alloy layer 5 exposed at the both outer faces as shown in FIG. 3B.

However, the content of zinc in the nickel-zinc alloy layer 5 was low, and therefore as a result of measuring the peel strength at the interface between the outer circuit 17 and the isolation layer 10, the dry peel strength was 1.92 kgf/cm, and the level of UL heat resistance at rating 130° C. defined in the UL 796 Standard was 0.50 kgf/cm, showing that the printed-wiring board 18 had poor UL heat resistance.

COMPARATIVE EXAMPLE 3

In this Comparative Example, the step of producing the printed-wiring board using a copper foil for printed-wiring board comprising only a nickel layer on the nodular treatment side of the electrodeposited copper foil will be described. First, production of the copper foil for printed-wiring board 1 will be described with reference to the drawings. Here, an electrodeposited copper foil having a cross section shown schematically in FIG. 8 for use in production of a copper foil having nominal thickness of 18 μm, which had not been subjected to surface treatment (hereinafter referred to as "untreated copper foil") was used. Then, a so called surface treatment apparatus was used to subject this untreated copper foil 2 to nodular treatment and surface treatment for forming the nickel layer.

In the surface treatment apparatus, copper microparticles 4 are first deposited on the surface of the matte side 3 of the untreated copper foil 2 under burnt copper plating conditions, and seal plating was carried out as level copper plating conditions so as to prevent the copper microparticles 4 from being dropped off, thereby depositing stably the copper microparticles 4 on the matte side 3 of the untreated copper foil 2. For the burnt copper plating conditions for the copper microparticles 4, plating was carried out under conditions of current density of 30 A/dm$^2$ and electrolysis time of 4 seconds by using an insoluble anode (DSE) for the counter electrode to make the copper foil itself undergo cathode polarization, in a copper sulfate solution at a liquid temperature of 30° C. with concentrations of copper and sulfuric acid being 12 g/l and 180 g/l, respectively. For the level copper plating conditions for the copper microparticles 4, plating was carried out under conditions of current density of 15 A/dm² and electrolysis time of 4 seconds by using the insoluble anode (DSE) for the counter electrode to make the copper foil itself undergo cathode polarization, in a copper sulfate solution at a liquid temperature of 30° C. with concentrations of copper and sulfuric acid being 40 g/l and 180 g/l, respectively.

Then, a nickel layer 5 was formed on the surface with copper microparticles 4 provided thereon. For this nickel layer 5, a nickel sulfate based solution was prepared so that the solution had a composition with 300 g/l of nickel sulfate ($NiSO_4 \cdot 7H_2O$), 50 g/l of nickel chloride ($NiCl_2$) and 40 g/l of boric acid ($H_3BO_3$), and in the solution at a liquid temperature of 30° C., the copper foil itself was made to undergo cathode polaraization with the use of a stainless plate for the counter electrode under conditions of current density of 24 A/dm² and electrolysis time of 12.6 seconds, thereby electro-depositing 8.15 g/m² of nickel.

The reduced thickness of the nickel layer 5 is 0.92 μm. In addition, the surface with the nickel layer 5 formed thereon was treated with a silane coupling agent and then dried to produce the copper foil for printed-wiring board 1 shown in FIG. 8. However, the silane coupling agent treated layer is not shown in the drawings.

Thereafter, the printed-wiring board 18 was produced by a method similar to that used in Example 1, comprised of the steps shown in FIGS. 2 to 5. This printed-wiring board 18 was used to measure the peel strength at the interface between the outer circuit 17 and the isolation layer 10. As a result, the dry peel strength was 1.85 kgf/cm, and the level of UL heat resistance at rating 130° C. defined in the UL 796 Standard was 0.30 kgf/cm, apparently showing that the printed-wiring board 18 had poor UL heat resistance.

INDUSTRIAL APPLICABILITY

By using the copper foil for printed-wiring board according to the present invention, laser drilling processing can easily be carried out in the process of a printed-wiring board, and selective etching advantageous for formation of a fine pitch circuit can be conducted, and high UL heat resistance can be ensured for a conductor circuit finally formed in the printed-wiring board. This copper foil for printed-wiring board excellent in total balance, which is the first of its type, will make it possible to introduce high quality printed-wiring boards to the market.

What is claimed is:

1. A copper foil for a printed-wiring board, said copper foil comprising a nodular treated side to be bonded to a substrate, wherein a nickel layer is provided on the nodular treated side, wherein the thickness (X) of the nickel layer is 0.7 g/m² to 45 g/m²; a zinc layer or a zinc alloy layer wherein the thickness (Y) of the zinc layer is 0.01 g/m² to 2 g/m² is provided on the nickel layer and an equivalent thickness (T) of nickel layer and zinc layer or zinc alloy layer calculated from Equation 1 is smaller than or equal to 5 μm, $$T = (X/8.85) + (Y/7.12)(\mu m) \qquad \text{Equation 1}$$

Specific gravity of nickel: 8.85 g/cm³
Specific gravity of zinc: 7.12 g/cm³.

2. A copper clad laminate comprising the copper foil of claim 1.

3. The copper foil for a printed-wiring board according to claim 1, wherein the thickness (X) of the nickel layer is 0.7 g/m² to 45 g/m², and the thickness (Y) of the zinc layer containing n kinds of alloying elements is 0.01 g/m² to 2 g/m², and the equivalent thickness (T) of the nickel layer and zinc layer is determined by the calculation procedure shown in Equation 2 is smaller than or equal to 5 μm, Equation 2

$\rho_{sum}$ represents specific gravity of the zinc alloy. This is a value converted as $\rho_{sum} = \{7.12 \times a + \rho_{Men} \times b_n)\}/100$, provided that the zinc alloy is comprised of a % by weight of Zn and n kinds of alloying elements, each alloying element is represented by $_{Men}$, the content of the alloying element is $\rho_{Men}$.

4. A copper clad laminate comprising the copper foil of claim 3.

* * * * *

UNITED STATES PATENT AND TRADEMARK OFFICE
CERTIFICATE OF CORRECTION

PATENT NO. : 6,989,199 B2 Page 1 of 1
APPLICATION NO. : 10/415143
DATED : January 24, 2006
INVENTOR(S) : Yamamoto et al.

It is certified that error appears in the above-identified patent and that said Letters Patent is hereby corrected as shown below:

Column 16, claim 3, line 34 after "Equation 2" please insert the following:

-- $T = (X/8.85) + (Y/p_{sum})$ (μm) --

Signed and Sealed this

Twenty-first Day of August, 2007

JON W. DUDAS
*Director of the United States Patent and Trademark Office*